(12) United States Patent
Nistler et al.

(10) Patent No.: US 8,004,280 B2
(45) Date of Patent: Aug. 23, 2011

(54) ARRANGEMENT FOR CONTROLLING INDIVIDUAL ANTENNAS OF AN ANTENNA ARRANGEMENT

(75) Inventors: Juergen Nistler, Erlangen (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 759 days.

(21) Appl. No.: 12/047,402

(22) Filed: Mar. 13, 2008

(65) Prior Publication Data

US 2008/0227416 A1    Sep. 18, 2008

(30) Foreign Application Priority Data

Mar. 13, 2007   (DE) .......................... 10 2007 012 052

(51) Int. Cl.
*G01V 3/00*    (2006.01)
*H04K 3/00*    (2006.01)

(52) U.S. Cl. ....................................... 324/309; 324/318
(58) Field of Classification Search .................. 324/309, 324/318, 322; 455/101
See application file for complete search history.

(56) References Cited

U.S. PATENT DOCUMENTS

| | | |
|---|---|---|
| 5,153,517 A | 10/1992 | Oppelt et al. |
| 7,221,162 B2 | 5/2007 | Feiweier et al. |
| 2005/0140369 A1* | 6/2005 | Feiweier et al. ............. 324/318 |
| 2008/0197922 A1* | 8/2008 | Schnell et al. ............ 330/124 R |

OTHER PUBLICATIONS

Patent Abstracts of Japan Publication No. 59200946 A—Date of Publication Nov. 14, 1984.

* cited by examiner

*Primary Examiner* — Lee Nguyen
(74) *Attorney, Agent, or Firm* — Schiff Hardin LLP

(57) ABSTRACT

An arrangement for controlling individual antennas of an antenna arrangement in a magnetic resonance apparatus has a device for signal division. This device is designed such that each transmission signal present at an input of the device for signal division is divided among all outputs of the device for signal division. Each output of the device for signal division is connected with a respective individual antenna. A number of transmission branches are provided for the inputs of the device for signal division. Each transmission branch has components that form a transmission signal that is modulated specific to the transmission branch and is amplified. Each transmission branch is connected with a respective associated input of the device for signal division, such that the transmission signal therefrom arrives at the associated input.

22 Claims, 5 Drawing Sheets

FIG 4
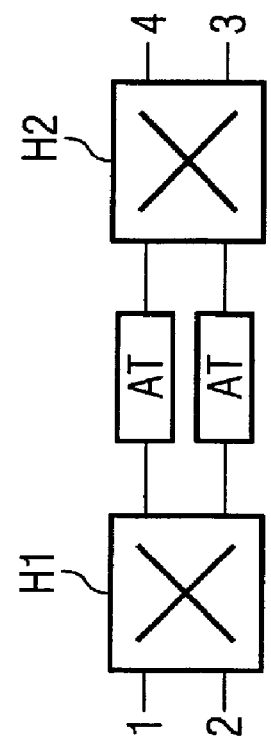
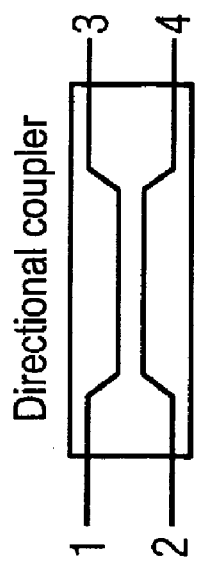

ARRANGEMENT FOR CONTROLLING INDIVIDUAL ANTENNAS OF AN ANTENNA ARRANGEMENT

BACKGROUND OF THE INVENTION

1. Field of the Invention

The present invention concerns an arrangement for controlling individual antennas of an antenna arrangement in a magnetic resonance apparatus.

2. Description of the Prior Art

Interaction between the tissue of a patient to be examined and the basic magnetic field used for magnetic resonance excitation occur in magnetic resonance apparatuses with basic magnetic field strengths that are greater than three Tesla. Such interaction leads to shadows in the tissue images acquired from the examination. These shadows make the clinical evaluation of the tissue images more difficult.

In such magnetic resonance apparatuses it is known to use multi-channel transmission systems in order to achieve a homogenization of the B1 field and in order to minimize the aforementioned shadows in the imaging.

A multi-channel transmission system has a number of transmission units that are independent of one another, each with a transmission power amplifier. An antenna arrangement with a number of antenna elements for radiation of radio-frequency transmission signals is used for the magnetic resonance examination. A transmission unit is permanently associated with each individual antenna element of the antenna arrangement. The number of the required transmission units independent of one another thus increase with increasing number of antenna elements.

Power reflected by an antenna element acts on the individual transmission power amplifier of the transmission unit associated with that antenna element.

The individual antenna elements additionally couple with one another. A portion of the radiated transmission power each considered transmission unit is "overcoupled" into further transmission units due to the coupling. Reflected and overcoupled power affect the outputs of the respective transmission power amplifiers.

To minimize the influence of the reflected transmission power on the transmission power amplifier, either one-way conductors or circulators could be connected between the transmission power amplifiers and the respective antenna elements. Such components, however, are disadvantageously lossy in the transmission direction, or require a static magnetic field for operation, which can be achieved only with difficulty in the operation of a magnetic resonance apparatuses.

FIG. 5 shows an arrangement for controlling individual antennas A1 through A8 of an antenna arrangement BKA (designed as a "birdcage") according to the prior art.

In total N=8 parallel transmission branches SZ51 through SZ58 are provided as transmission units corresponding to the eight individual antennas A1 through A8.

Each individual transmission branch SZ51 through SZ58 respectively comprises a modulator MOD, a transmission power amplifier PA and a transmission-reception unit Tx/Rx.

A transmission signal is modulated by the modulator MOD dependent on the transmission branch SZ51 through SZ58, amplified with the aid of the transmission power amplifier PA and arrives at an antenna element A1 through A8 (associated with the transmission branch SZ51 through SZ58) of the antenna arrangement BKA via the transmission-reception device Tx/Rx.

The transmission-reception devices Tx/Rx could thereby be designed as time-controlled cross-over switches, for example.

Received signals arrive at a common reception branch EZ51 (which has a receiver REC and an analog-digital converter ADC) from the individual antennas A1 through A8 via the correspondingly switched eight transmission-reception devices Tx/Rx. The received signals are thus digitally converted and relayed for further processing.

SUMMARY OF THE INVENTION

An object of the present invention is to provide an arrangement for controlling individual antennas or antenna elements of an antenna arrangement that can be executed with less expenditure, is improved with regard to the reflected transmission power.

This object is achieved in accordance with the invention by an arrangement for controlling individual antennas or antenna elements of an antenna arrangement in a magnetic resonance apparatus, wherein the arrangement includes a device for signal division (splitting). This device is designed such that every transmission signal that is present at the input of the device for signal division is divided among all outputs of the device for signal division. Every output of the device for signal division is connected with one of the respective individual antennas.

The device for signal division is preferably designed as a type of device known as an N*N Butler matrix, i.e. with N inputs and with N outputs.

A number of transmission branches are provided for the inputs of the device for signal division. Each signal branch includes components that form a transmission signal that is modulated specific to the transmission branch and is amplified.

Each transmission branch is connected with a respective associated input of the device for signal division, such that the transmission signal therefrom arrives at the associated input.

The coupling between the individual transmission branches is reduced by the inventive use of a device for signal division.

The reflection of the radio-frequency transmission energy back into the transmission branch is minimized by the inventive arrangement.

In an embodiment the transmission signals of the individual transmission branches differ in terms of their modulation, such that an additional improvement of the examination result is achieved by the independent transmission branches.

A faster calculation of radio-frequency pulses for a parallel transmission operation is enabled by the inventive arrangement since an equation system required for this purpose is significantly smaller due to the connection of the antenna elements via the mode matrix.

BRIEF DESCRIPTION OF THE DRAWINGS

FIG. 4 shows an exemplary directional coupler for use in FIG. 2.

DESCRIPTION OF THE PREFERRED EMBODIMENTS

Figure 1:
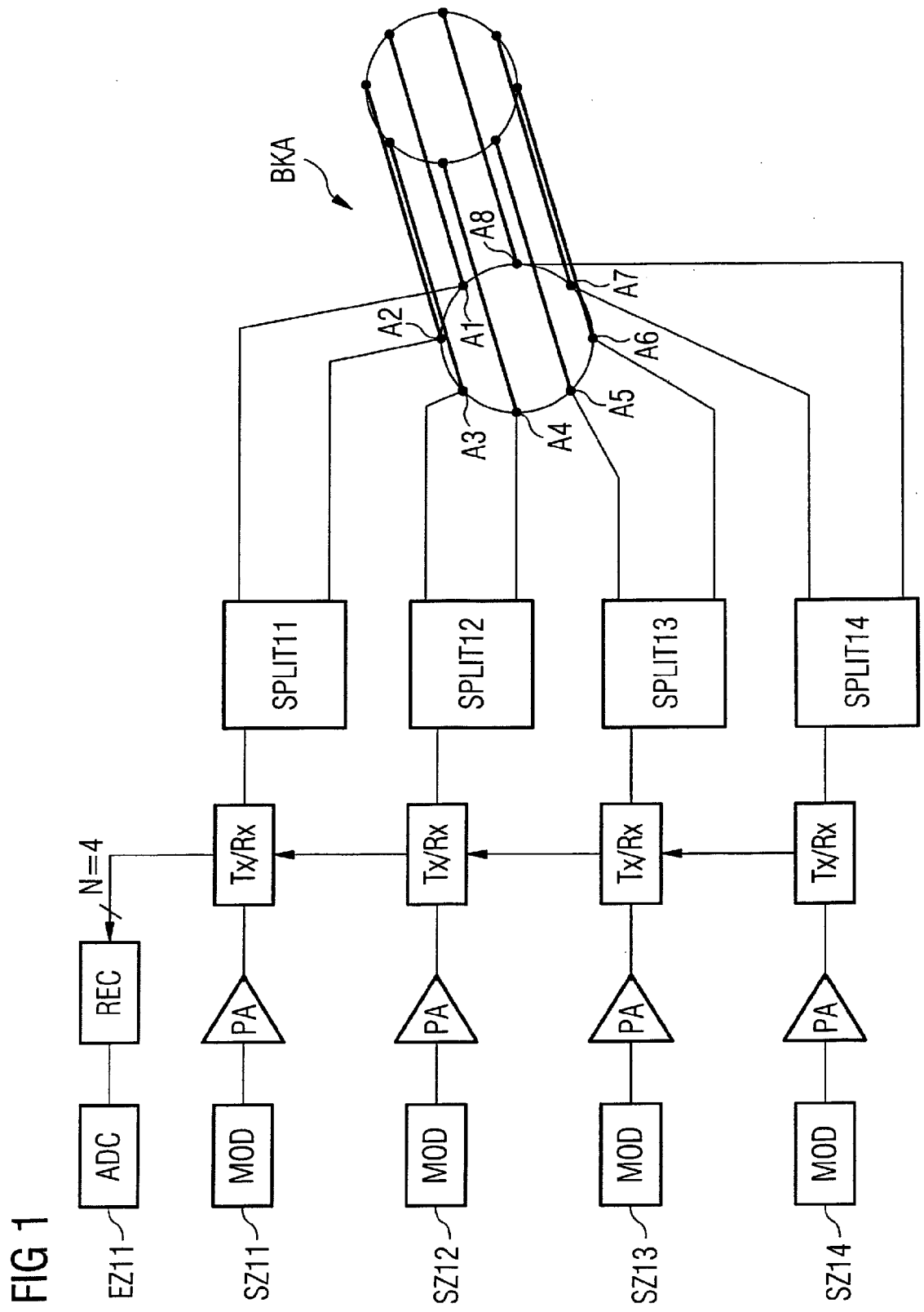
FIG. 1 schematically illustrates a first embodiment of the inventive arrangement.

FIG. 1 shows a first embodiment of the inventive arrangement with an antenna arrangement BKA designed as a "birdcage" that has eight individual antennas A1 through A8.

Four transmission branches SZ11, SZ12, SZ13 and SZ14 are used on the transmission side. Each of the transmission branches SZ11 through SZ14 has a modulator MOD, a transmission power amplifier PA and a transmission-reception unit Tx/Rx.

In a first transmission branch SZ11 a first transmission signal is modulated by the modulator MOD specific to the transmission branch and arrives at the transmission-reception unit Tx/Rx as an amplified transmission signal via the transmission power amplifier PA. This is switched through in the transmission case so that the amplified transmission signal arrives at a device for signal division SPLIT11. The device for signal division is subsequently also designated as a splitter, which thus can be designed as an adaptive power splitter or as a simple parallel circuit.

The amplified transmission signal is divided up with the aid of the splitter SPLIT11 and is relayed to two associated individual antennas A1 and A2 of the antenna arrangement BKA.

The further transmission branches SZ12 through SZ14 are correspondingly designed so that an amplified transmission signal of a second transmission branch SZ12 is relayed to two associated individual antennas A3 and A4 of the antenna arrangement BKA.

An amplified transmission signal of a third transmission branch SZ13 is correspondingly relayed to two associated antenna elements A5 and A6 of the antenna arrangement BKA while an amplified transmission signal of a fourth transmission branch SZ14 is relayed to two associated individual antennas A7 and A8 of the antenna arrangement BKA.

Received signals of the antenna elements A1 through A8 arrive via the respective splitters SPLIT 11 through SPLIT14 and the correspondingly connected transmission-reception devices Tx/Rx at a common reception branch EZ11 for further processing. This reception branch EZ11 in turn has a common receiver REC as well as an analog-digital converter ADC.

This embodiment utilizes the advantages of an antenna arrangement with many individual antennas, for example their higher quality and their homogeneous field structure even in edge regions. At the same time only a reduced number of transmission branches are required relative to the prior art in order to be able to implement examinations.

Figure 2:
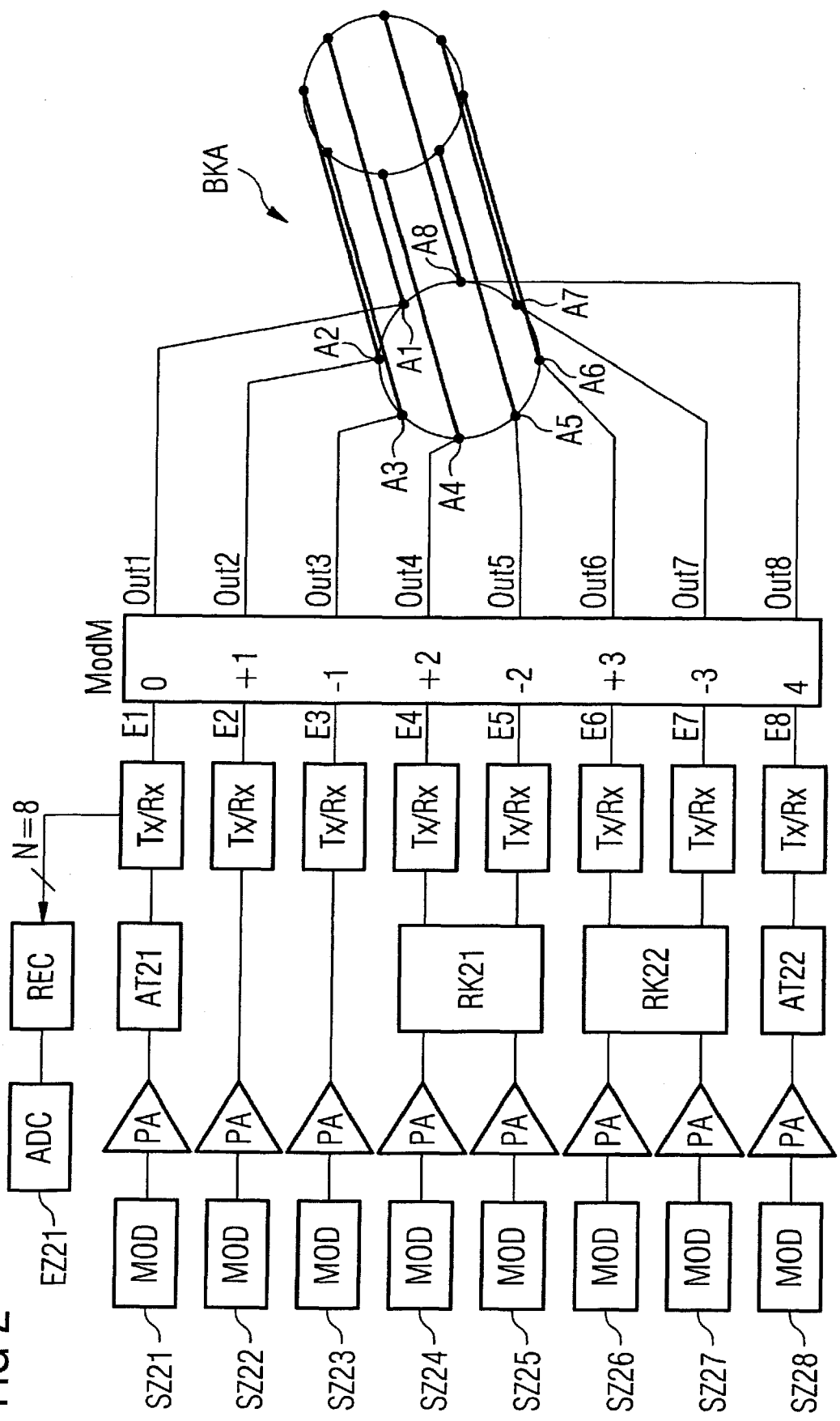
FIG. 2 schematically illustrates a second embodiment of the inventive arrangement.

FIG. 2 shows an advantageous second embodiment of the inventive arrangement with an antenna arrangement BKA designed as a "birdcage" that has eight individual antennas A1 through A8.

Instead of the individual devices for signal division SPLIT11 through SPLIT14 shown in FIG. 1, here a common device is used for signal division ModM. This is also designated as a mode matrix and is designed as a Butler matrix, for example.

In the advantageous embodiment of the invention presented here a Butler matrix with eight inputs E1 through E8 and eight outputs Out1 through Out8 is used.

On the transmission side N=8 transmission branches SZ21 through SZ28 are used, whereby each of the transmission branches SZ21 through SZ28 respectively comprises a modulator MOD, a transmission power amplifier PA and a transmission-reception unit Tx/Rx.

In a first transmission branch SZ21 a first transmission signal is modulated by the modulator MOD specific to the transmission branch and arrives at the transmission-reception unit Tx/Rx as an amplified transmission signal via the transmission power amplifier PA and an adaptation device AT21. This is switched through in the transmission case so that the amplified transmission signal arrives at a first input E1 of the device for signal division ModM. This first input E1 forms what is known as a "Mode 0" oscillation in the antenna arrangement BKA in the transmission case.

In a second transmission branch SZ22 a second transmission signal is modulated by the modulator MOD specific to the transmission branch and arrives at the transmission-reception unit Tx/Rx as an amplified transmission signal via the transmission power amplifier PA. This is switched through in the transmission case so that the amplified transmission signal arrives at a second input E2 of the device for signal division ModM. This second input E2 forms what is known as a "Mode+1" oscillation in the antenna arrangement BKA in the transmission case, the oscillation being circular and clockwise.

In a third transmission branch SZ23 a third transmission signal is modulated by the modulator MOD specific to the transmission branch and arrives at the transmission-reception unit Tx/Rx as an amplified transmission signal via the transmission power amplifier PA. This is switched through in the transmission case so that the amplified transmission signal arrives at a third input E3 of the device for signal division ModM. This third input E3 forms what is known as a "Mode−1" oscillation in the antenna arrangement BKA in the transmission case, which oscillation is circular and counter-clockwise.

In a fourth transmission branch SZ24 a fourth transmission signal is modulated by the modulator MOD specific to the transmission branch and arrives at a first input of a first directional coupler RK21 as an amplified transmission signal via the transmission power amplifier PA.

In a fifth transmission branch SZ25 a fifth transmission signal is modulated by the modulator MOD specific to the transmission branch and arrives at a second input of the first directional coupler RK21 as an amplified transmission signal via the transmission power amplifier PA.

The first directional coupler RK21 divides up the amplified transmission signals supplied to it so that the amplified fourth transmission signal arrives at a fourth input E4 and a fifth input E5 of the device for signal division ModM via both a transmission-reception device Tx/Rx of the fourth transmission branch SZ24 and via a transmission-reception device Tx/Rx of the fifth transmission branch SZ25.

The amplified fifth transmission signal correspondingly arrives at the fourth input E4 and at the fifth input E5 of the device for signal division ModM via the transmission-reception device Tx/Rx of the fourth transmission branch SZ24 and via the transmission-reception device Tx/Rx of the fifth transmission branch SZ25.

The fourth input E4 forms what is known as a "Mode+2" oscillation in the antenna arrangement BKA in the transmission case, which oscillation is circularly polarized in the clockwise direction. The fifth input E5 thus forms what is known as a "Mode−2" oscillation that is circularly polarized in the counter-clockwise direction.

In a sixth transmission branch SZ26 a sixth transmission signal is modulated by the modulator MOD specific to the transmission branch and arrives at a first input of a second directional coupler RK22 as an amplified transmission signal via the transmission power amplifier PA.

In a seventh transmission branch SZ27 a seventh transmission signal is modulated by the modulator MOD specific to the transmission branch and arrives at a second input of the second directional coupler RK22 as an amplified transmission signal via the transmission power amplifier PA.

The second directional coupler RK22 divides up the amplified transmission signals supplied to it so that the amplified sixth transmission signal arrives at a sixth input E6 and a seventh input E7 of the device for signal division ModM via both a transmission-reception device Tx/Rx of the sixth transmission branch SZ26 and via a transmission-reception device Tx/Rx of the seventh transmission branch SZ27.

The amplified seventh transmission signal correspondingly arrives at the sixth input E6 and at the seventh input E7 of the device for signal division ModM via the transmission-reception device Tx/Rx of the sixth transmission branch SZ26 and via the transmission-reception device Tx/Rx of the seventh transmission branch SZ27.

The sixth input E6 forms what is known as a "Mode+3" oscillation in the antenna arrangement BKA in the transmission case, which oscillation is circularly polarized in the clockwise direction.

The seventh input E7 forms what is known as a "Mode−3" oscillation in the antenna arrangement BKA in the transmission case, this oscillation being circularly polarized in the counter-clockwise direction.

In an eighth transmission branch SZ28 an eighth transmission signal is modulated by the modulator MOD specific to the transmission branch and arrives at the transmission-reception unit Tx/Rx as an amplified transmission signal via the transmission power amplifier PA and via an adaptation device AT22. This is switched through in the transmission case so that the amplified transmission signal arrives at an eighth input E8 of the device for signal division ModM. This eighth input E8 forms what is known as a "Mode4" oscillation in the antenna arrangement BKA in the transmission case, the oscillation being linearly polarized.

The device for signal division ModM divides each of the amplified transmission signals supplied to it into eight output signals. For example, the amplified first transmission signal of the first signal branch SZ21 is divided up into eight output signals for the eight outputs Out1 through Out8 of the device for signal division ModM. Parts of the amplified first transmission signal of the first transmission branch SZ21 therewith arrive at all eight antenna elements A1 through A8 of the antenna arrangement BKA. Each of the outputs Out1 through Out8 of the device for signal division ModM is correspondingly connected with a respective antenna element A1 through A8 of the antenna arrangement BKA.

A signal (that, for example can be associated with the transmission signal of the first transmission branch SZ21) is correspondingly received proportionally via all eight antenna elements A1 through A8 upon reception and arrives at the device for signal division ModM via the eight outputs Out1 through Out8. This combines the proportional signals and relays this combined reception signal via the first input E1 and via the correspondingly connected transmission-reception devices Tx/Rx to the common reception branch EZ21 for further processing. This reception branch EX21 in turn comprises a common receiver REC as well as an analog-digital converter ADC.

The same applies for the received signals that can be associated with the transmission signals of the transmission branches SZ22 through SZ28.

The device for signal division ModM is fashioned here as a Butler matrix, such that this is used both for decoupling between the individual antenna elements A1 through A8 and for adaptation.

The connections E2, E3, E4, E5, E6 and E7 respectively have a low reflection factor for antenna loads (for example patients or measurement subjects) that are approximately rotationally symmetrical.

However, load-dependent per-pair couplings exist between the connections E2 and E3 (subsequently described by the S-parameter S1-1), between the connections E4 and E5 (subsequently described by the S-parameter S2-2) and between the connections E6 and E7 (subsequently described by the S-parameter S3-3).

The antenna arrangement or the array antenna can be attuned to the connections A1 through A8 via a suitable dimensioning of adaptation elements (not shown) such that the coupling between the connections E2 and E3 is minimized to a value of "0" for a specific load case. This tuning is implemented for a patient strongly loading the antenna arrangement, for example, given which a maximum power requirement for the transmission signals also occurs. In this case a maximum power fed into the connection E2 for the excitation of the basic mode is provided without further measures at the connections E2 and E3.

In order to produce a decoupling for higher mode pairs, directional couplers that compensate for the coupling between the connections E4 and E5 and between the connections E6 and E7 are mounted before the connections E4 and E5 as well as E6 and E7.

The directional couplers RK21 and RK22 described above are provided for this purpose.

The coupling of the two directional couplers RK21 and RK22 is selected such that the coupling for a standard load of the antenna arrangement BKA is directly compensated. The coupling factor could possibly also be varied dependent on the respective real patient load.

The connection E1 for the "Mode 0" oscillation and the connection E8 for the "Mode 4" oscillation exhibit a reflection factor that is dependent on the reflection factor of the antenna arrangement BKA and therewith dependent on the load. The respective adaptation devices for AT21 and AT22 are therefore provided in both of the associated transmission branches SZ21 and SZ28.

This embodiment utilizes the advantages of an antenna arrangement with many individual antennas, namely their higher quality and their homogeneous field structure even in edge regions.

Not only the clockwise waves of the "Mode+1" oscillation, the "Mode+2" oscillation and the "Mode+3" oscillation but also the less effective counter-clockwise waves of the "Mode−1" oscillation, the "Mode−2" oscillation and the "Mode−3" oscillation are advantageously used for examination in this embodiment since these also contain small clockwise components in close range of the antenna conductors or antenna elements.

The aforementioned oscillations or, respectively, modes can, for example, be defined via the following formula:

$$l(m,k)=l\_m^* \exp(2j^* \pi^* m^* n/N)$$

wherein:

l is an associated current of an antenna element or antenna rod,

N is the total number of antenna elements or antenna rods (for example, N=8), n is the individual number of the antenna element or antenna rod (for example, 1 through 8)

m is the number of the mode under consideration (thus −3, . . . , 4), l_m is the complex amplitude of the mode with the number m, l(m,k) is the current contribution of the mode m at the antenna rod n, and $j=\sqrt{-1}$.

Figure 3:
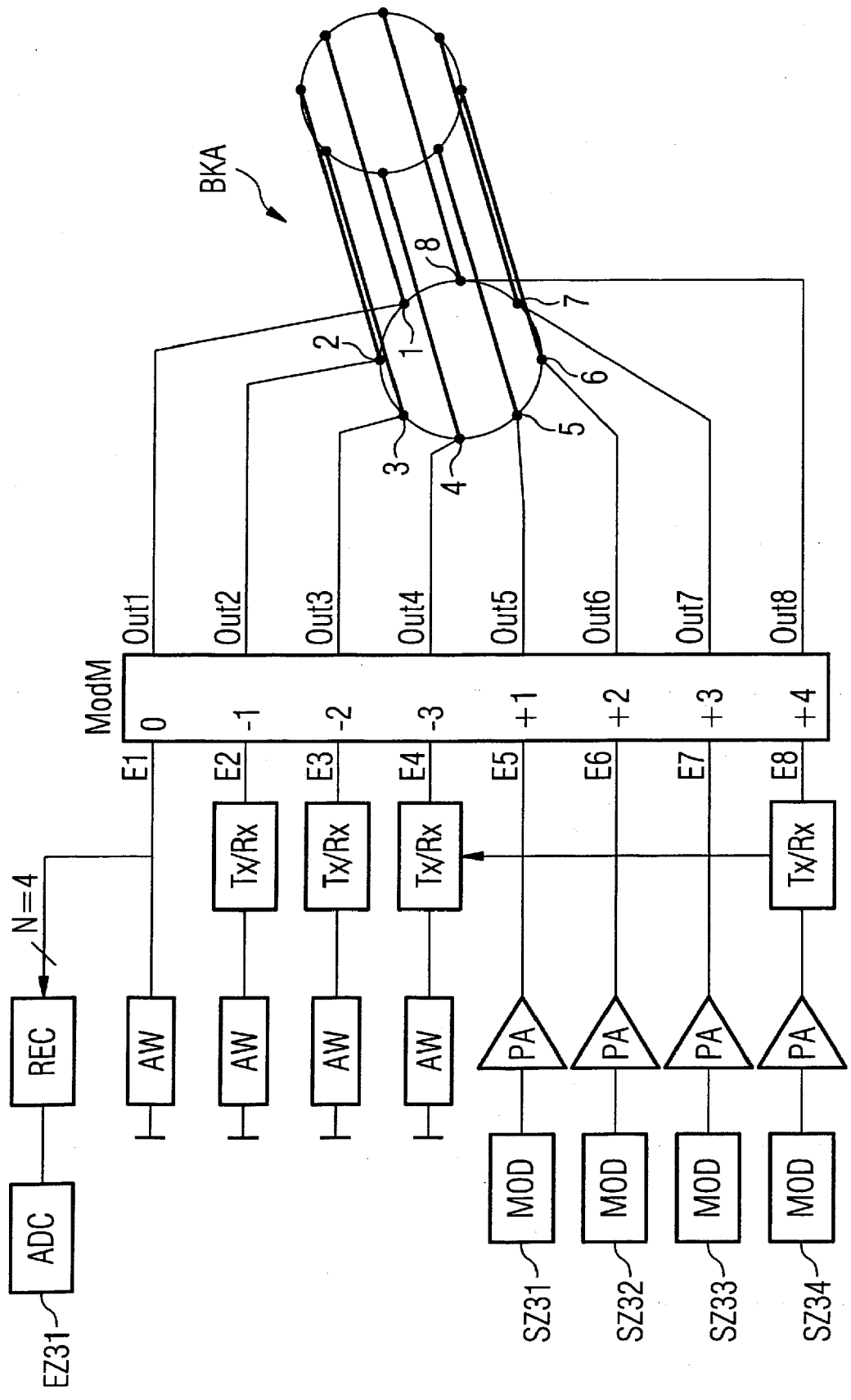
FIG. 3 schematically illustrates a third embodiment of the inventive arrangement.
Figure 5:
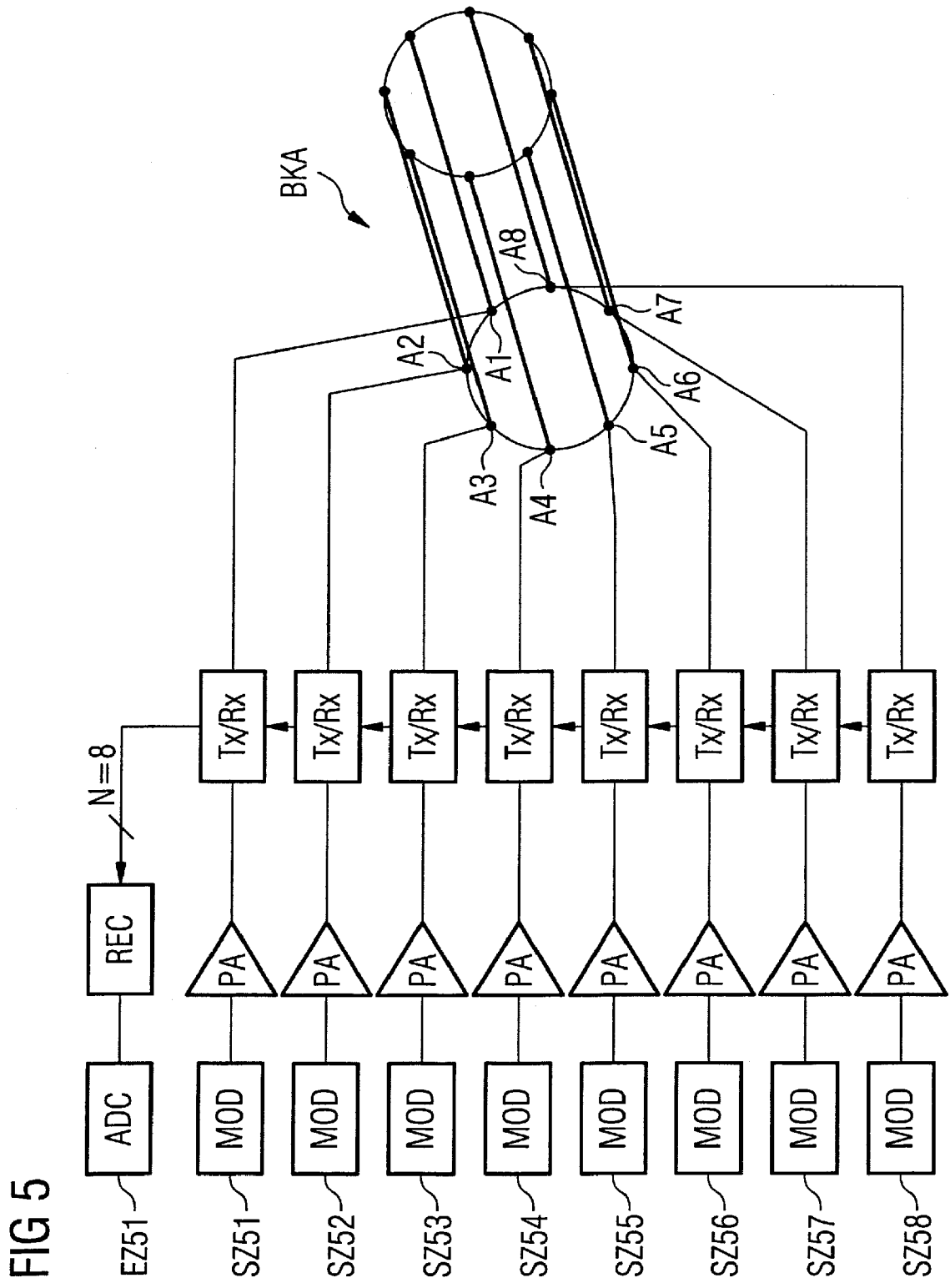
FIG. 5 shoes the arrangement described above for controlling individual antennas of an antenna arrangement according to the prior art.

FIG. 3 shows an advantageous third embodiment of the inventive arrangement with an antenna arrangement BKA designed as a "birdcage" that has eight individual antennas A1 through A8.

A Butler matrix with eight inputs E1 through E8 and eight outputs Out1 through Out8 is again used as a device for signal division ModM.

On the transmission side N=4 transmission branches SZ31 through SZ34 are used, whereby each of the transmission branches SZ31 through SZ41 each having a modulator MOD and a transmission power amplifier PA.

The transmission branch SZ34 additionally comprises a transmission-reception unit Tx/Rx that is downstream of the associated transmission power amplifier PA.

A first input E1 of the device for signal division ModM is connected with a compensation potential via a termination resistor AW. Partial signals received via the antenna elements A1 through A8 form what is known as a "Mode 0" oscillation at this connection E1.

A second input E2 of the device for signal division ModM is connected with the compensation potential via a transmission-reception device Tx/Rx and via a termination resistor AW. Partial signals received via the antenna elements A1 through A8 form what is known as a "Mode 1" oscillation at this connection E2.

A third input E3 and a fourth input of the device for signal division ModM are likewise connected with the compensation potential via a respective transmission-reception device Tx/Rx and via a respective termination resistor AW.

Partial signals received via the antenna elements A1 through A8 form what is known as a "Mode 2" oscillation at the connection E3 while partial signals received via the antenna elements A1 through A8 form what is known as a "Mode 3" oscillation at the connection E4

In a first transmission branch SZ31 a first transmission signal is modulated by the modulator MOD specific to the transmission branch and arrives as an amplified transmission signal at a fifth input E5 of the device for signal division ModM via the transmission power amplifier PA. In the transmission case this connection or, respectively, the fifth input E5 forms what is known as a "Mode+1" oscillation in the antenna arrangement BKA.

Corresponding thereto, in a second transmission branch SZ32 a second transmission signal is modulated by the modulator MOD specific to the transmission branch and arrives as an amplified transmission signal at a sixth input E6 of the device for signal division ModM via the transmission power amplifier PA. In the transmission case this connection or the sixth input E6 forms what is known as a "Mode+2" oscillation in the antenna arrangement BKA.

Corresponding thereto, in a second transmission branch SZ33 a third transmission signal is modulated by the modulator MOD specific to the transmission branch and arrives as an amplified transmission signal at a seventh input E7 of the device for signal division ModM via the transmission power amplifier PA. In the transmission case this connection or the seventh input E7 forms what is known as a "Mode+3" oscillation in the antenna arrangement BKA.

In a fourth transmission branch SZ34 a fourth transmission signal is modulated by the modulator MOD specific to the transmission branch and arrives as an amplified transmission signal at the transmission-reception unit Tx/Rx via the transmission power amplifier PA. In the transmission case this is switched through, such that the amplified transmission signal arrives at an eighth input E8 of the device for signal division ModM. In the transmission case this connection or the eighth input E8 forms what is known as a "Mode+4" oscillation in the antenna arrangement BKA.

The device for signal division ModM divides each of the amplified transmission signals supplied to it into eight output signals. For example, the amplified first transmission signal of the first signal branch SZ31 is divided up into eight output signals for the eight outputs Out1 through Out8 of the device for signal division ModM. Parts of the amplified first transmission signal of the first transmission branch SZ31 therewith arrive at all eight antenna elements A1 through A8 of the antenna arrangement BKA. Each of the outputs Out1 through Out8 of the device for signal division ModM is correspondingly connected with a respective antenna element A1 through A8 of the antenna arrangement BKA.

Reflected signals or received signals arrive from the antenna elements A1 through A8 to the eight connections E1 through E8 of the device for signal division ModM via the eight connections Out1 through Out8 of the device for signal division ModM.

The reflected signals are supplied via the correspondingly connected transmission-reception devices Tx/Rx that are provided at the connections E2, E3, E4 and E8 to the common reception branch EZ31 for further processing. This reception branch EZ31 in turn comprises a common receiver REC as well as an analog-digital converter ADC.

The "Mode+1" oscillation is to be associated with a circularly-polarized field. A transmitted signal with "Mode+1" oscillation correspondingly also forms a portion of a "Mode−1" oscillation upon receipt. In order to mask out interferences, the respective absorber or termination resistor AW is provided.

The "Mode 0," oscillation forms no circularly-polarized field.

Given adjacent antenna elements the "Mode+4" oscillation effects a phase of 180°, such that this can be considered as a current loop.

The advantage of this arrangement is that only a few transmission branches are required while the advantages of an antenna arrangement with many individual antennas can be utilized, namely the already described higher quality and their homogeneous field structure even in edge regions.

FIG. 4 shows an exemplary directional coupler for use in FIG. 2.

The directional coupler is thereby fashioned with two connections 1, 2 as inputs and with three connections 3, 4 as outputs as a series of a first 90° hybrid H1, two identically tuned adaptation networks AT and a second 90° hybrid H2.

S-parameters for eight inputs of a system made up of butler matrix, antenna and patient are shown in the following:

|  | Mode 0 | Mode +1 rcp | Mode +2 rcp | Mode +3 rcp | Mode 4 lp | Mode −3 lcp | Mode −2 lcp | Mode −1 lcp |
| --- | --- | --- | --- | --- | --- | --- | --- | --- |
| Mode 0 | S00 | 0 | 0 | 0 | 0 | 0 | 0 | 0 |
| Mode 1 | 0 | 0 | 0 | 0 | 0 | 0 | 0 | S1-1 |
| Mode 2 | 0 | 0 | 0 | 0 | 0 | 0 | S2-2 | 0 |
| Mode 3 | 0 | 0 | 0 | 0 | 0 | S3-3 | 0 | 0 |
| Mode 4 | 0 | 0 | 0 | 0 | S44 | 0 | 0 | 0 |
| Mode −3 | 0 | 0 | 0 | S3-3 | 0 | 0 | 0 | 0 |
| Mode −2 | 0 | 0 | S2-2 | 0 | 0 | 0 | 0 | 0 |
| Mode −1 | 0 | S1-1 | 0 | 0 | 0 | 0 | 0 | 0 |

"rcp" thereby designates a clockwise circularly-polarized oscillation, "lcp" a counter-clockwise circularly-polarized oscillation and "lp" a linearly-polarized oscillation.

It should be noted that "Mode 0" exhibits no field-affecting portion.

A fast calculation of individual signals for a pulsed transmission is possible via a simplified S parameter set.

Orthogonal field structures that are decoupled from one another are excited in the antenna arrangement BKA with the aid of the mode matrix ModM.

For a specific orientation of the basic magnetic field only nuclear spins with clockwise circular portions of the exciting radio-frequency fields interact, for example. A splitting of the predominantly clockwise or, respectively, predominantly counter-clockwise field modes ensues via the mode matrix. The number of the transmission channels can therewith be halved nearly without disadvantage in FIG. 2.

Via the antenna tuning shown above S1-1 can be brought to a value of "0", such that only S00, S2-2, S3-3 and S44 remain.

Although modifications and changes may be suggested by those skilled in the art, it is the intention of the inventors to embody within the patent warranted hereon all changes and modifications as reasonably and properly come within the scope of their contribution to the art.

We claim as our invention:

1. An arrangement for controlling N individual antennas of an antenna arrangement in a magnetic resonance apparatus, said arrangement comprising:
   a signal division device comprising a plurality of inputs and N outputs, each input having a transmission signal thereat and said signal division device dividing each transmission signal among all of said N outputs;
   said signal division device comprising a plurality of transmission branches, each of said transmission branches comprising a plurality of components that form a modulated transmission signal that is modulated specifically to that transmission branch and that is amplified, thereby making the transmission signal specific to that transmission branch;
   the respective outputs of said signal division device being connected to respective individual antennas of the antenna arrangement;
   said transmission branches being respectively connected with respective inputs of said signal division device to supply the transmission signal from that transmission branch to the input of the signal division device connected thereto; and
   said plurality of inputs of said signal division device and said plurality of transmission branches each being equal to N, and each of said transmission branches comprising a modulator that modulates said transmission signal specific to that transmission branch, a transmission power amplifier that amplifies the modulated transmission signal, and a transmission reception unit that connects that transmission branch with one of the inputs of the device for signal division.

2. An arrangement as claimed in claim 1 wherein N=9, and wherein an $n^{th}$ input of said signal division device is connected with an $n^{th}$ transmission branch, with $1 \leq n \leq 8$.

3. An arrangement as claimed in claim 2 comprising:
   the transmission-reception unit of a first of said transmission branches being connected to a first of said inputs, and the components of the first of said transmission branches forming a Mode0 oscillation in said antenna arrangement;
   the transmission-reception unit of a second of said transmission branches being connected to a second of said inputs, and the components of the second of said transmission branches forming a Mode+1 oscillation in said antenna arrangement;
   the transmission-reception unit of a third of said transmission branches being connected to a third of said inputs, and the components of the third of said transmission branches forming a Mode−1 oscillation in said antenna arrangement;
   the transmission-reception unit of a fourth of said transmission branches being connected to a fourth of said inputs, and the components of the fourth of said transmission branches forming a Mode+2 oscillation in said antenna arrangement;
   the transmission-reception unit of a fifth of said transmission branches being connected to a fifth of said inputs, and the components of the fifth of said transmission branches forming a Mode−2 oscillation in said antenna arrangement;
   the transmission-reception unit of a sixth of said transmission branches being connected to a sixth of said inputs, and the components of the sixth of said transmission branches forming a Mode+3 oscillation in said antenna arrangement;
   the transmission-reception unit of a seventh of said transmission branches being connected to a seventh of said inputs, and the components of the seventh of said transmission branches forming a Mode−3 oscillation in said antenna arrangement; and
   the transmission-reception unit of a eighth of said transmission branches being connected to a eighth of said inputs, and the components of the eighth of said transmission branches forming a Mode4 oscillation in said antenna arrangement.

4. An arrangement as claimed in claim 3 wherein at least one of said first of said transmission branches and said eighth of said transmission branches comprises a signal adaptation device connected between the transmission power amplifier therein and the transmission-reception unit therein.

5. An arrangement as claimed in claim 3 comprising:
   in each of said fourth of said transmission branches and said fifth of said transmission branches, a directional coupler connected between the transmission power amplifier therein and the transmission-reception unit therein, each direction coupler comprising first and second inputs and first and second outputs;
   the transmission power amplifier of the fourth of said transmission branches being connected to the first input of the directional coupler;
   the transmission power amplifier of said first said of said transmission branches being connected with the second input of the directional coupler;
   the first output of the directional coupler being connected with the transmission/reception unit of said fourth of said transmission branches; and
   the second output of the directional coupler being connected with the transmission/reception unit of said fifth of said transmission branches.

6. An arrangement as claimed in claim 5 wherein each directional coupler comprises a first 90° hybrid and a second 90° hybrid connected in series with respective outputs of said first 90° hybrid being connected with respective inputs of said second 90° hybrid via an adaptation network, the respective adaptation networks in the respective fourth and fifth of said transmission branches being identically matched.

7. An arrangement as claimed in claim 3 comprising:
   in each of said sixth of said transmission branches and said seventh of said transmission branches, a directional coupler connected between the transmission power amplifier therein and the transmission-reception unit therein, each direction coupler comprising first and second inputs and first and second outputs;
   the transmission power amplifier of the sixth of said transmission branches being connected to the first input of the directional coupler;
   the transmission power amplifier of said first said of said transmission branches being connected with the second input of the directional coupler;
   the first output of the directional coupler being connected with the transmission/reception unit of said sixth of said transmission branches; and the second output of the directional coupler being connected with the transmission/reception unit of said seventh of said transmission branches.

8. An arrangement as claimed in claim 7 wherein each directional coupler comprises a first 90° hybrid and a second 90° hybrid connected in series with respective outputs of said first 90° hybrid being connected with respective inputs of said second 90° hybrid via an adaptation network, the respective adaptation networks in the respective sixth and seventh of said transmission branches being identically matched.

9. An arrangement as claimed in claim 1 comprising a signal processor wherein signals respectively received by said individual antennas of said antenna arrangement are processed, said signal division device being connected between said individual antennas and said signal processor.

10. An arrangement as claimed in claim 1 wherein said signal division device is a matrix selected from the group consisting of a mode matrix and a Butler matrix.

11. An arrangement as claimed in claim 1 wherein said antenna arrangement is a birdcage antenna arrangement and wherein said individual antennas comprise respective antenna rods of said birdcage antenna arrangement.

12. An arrangement for controlling N individual antennas of an antenna arrangement in a magnetic resonance apparatus, said arrangement comprising:
a signal division device comprising a plurality of inputs and N outputs, each input having a transmission signal thereat and said signal division device dividing each transmission signal among all of said N outputs;
said signal division device comprising a plurality of transmission branches, each of said transmission branches comprising a plurality of components that form a modulated transmission signal that is modulated specifically to that transmission branch and that is amplified, thereby making the transmission signal specific to that transmission branch;
the respective outputs of said signal division device being connected to respective individual antennas of the antenna arrangement;
said transmission branches being respectively connected with respective inputs of said signal division device to supply the transmission signal from that transmission branch to the input of the signal division device connected thereto; and
said plurality of transmission branches and said plurality of input of said device for signal division each being equal to N/2, and each of said transmission branches comprising a modulator that modulates the transmission signal in that transmission branch with a modulation that is specific to that transmission branch, and a transmission power amplifier that amplifies the modulated signal and supplies an amplified, modulated signal to an input of said signal division device connected thereto, and at least one of said transmission branches comprising a transmission/reception unit connected after the transmission power amplifier therein to supply the amplified, modulated signal from said at least one of said transmission branches to the input connected thereto via said transmission/reception unit.

13. An arrangement as claimed in claim 12 wherein N=8, and wherein an $n^{th}$ input of said signal division device is connected with an $n^{th}$ transmission branch, with $1 \leq n \leq 4$.

14. An arrangement as claimed in claim 13 comprising:
the transmission-reception unit of a first of said transmission branches being connected to a first of said inputs, and the components of the first of said transmission branches forming a Mode+1 oscillation in said antenna arrangement;
the transmission-reception unit of a second of said transmission branches being connected to a second of said inputs, and the components of the second of said transmission branches forming a Mode+2 oscillation in said antenna arrangement;
the transmission-reception unit of a third of said transmission branches being connected to a third of said inputs, and the components of the third of said transmission branches forming a Mode+3 oscillation in said antenna arrangement; and
the transmission-reception unit of a fourth of said transmission branches being connected to a fourth of said inputs, and the components of the fourth of said transmission branches forming a Mode+4 oscillation in said antenna arrangement.

15. An arrangement as claimed in claim 14 wherein said fourth of said transmission branches comprises said at least one transmission branch comprising said transmission/reception unit.

16. An arrangement as claimed in claim 13 wherein said signal division device comprises at least one input that is connected to one of said plurality of transmission branches, and comprising a transmission/reception unit connected to said at least one of said inputs that connects said at least one of said inputs with a compensation potential.

17. An arrangement as claimed in claim 12 comprising a signal processor wherein signals respectively received by said individual antennas of said antenna arrangement are processed, said signal division device being connected between said individual antennas and said signal processor.

18. An arrangement for controlling N individual antennas of an antenna arrangement in a magnetic resonance apparatus, said arrangement comprising:
a multi-channel transmission system comprising N/2 transmission branches, each of said transmission branches comprising a modulator therein that modulates a signal in that transmission branch to produce a transmission signal that is modulated specific to that transmission branch, and an amplifier that amplifies the specific, modulated transmission signal;
N/2 signal division devices each comprising one input and two outputs, each of said signal division devices dividing a signal at the input thereof among both outputs thereof;
the respective outputs of said signal division devices being respectively connected with said individual antennas;
the respective transmission branches being connected with respective inputs of said signal division devices to supply the transmission signal therefrom to two of said individual antennas via the signal division device connected thereto.

19. An arrangement as claimed in claim 18 comprising a plurality of transmission/reception units that respectively connect the respective transmission branches to the respective inputs of the respective signal division devices.

20. An arrangement as claimed in claim 18 wherein N=8, and wherein an $n^{th}$ input of said signal division device is connected with an $n^{th}$ transmission branch, with $1 \leq n \leq 4$.

21. An arrangement as claimed in claim 18 comprising a signal processor wherein signals respectively received by said individual antennas of said antenna arrangement are processed, said signal division device being connected between said individual antennas and said signal processor.

22. An arrangement as claimed in claim 18 wherein said antenna arrangement is a birdcage antenna arrangement and wherein said individual antennas comprise respective antenna rods of said birdcage antenna arrangement.

* * * * *